United States Patent [19]

Friede et al.

[11] Patent Number: 5,138,622

[45] Date of Patent: Aug. 11, 1992

[54] APPARATUS AND METHOD FOR GENERATING HIGH-POWER, HIGH-VOLTAGE PULSES, PARTICULARLY FOR TE GAS LASERS

[75] Inventors: Dirk Friede, Goldbach; Willi Bette, Erlangen, both of Fed. Rep. of Germany

[73] Assignee: Siemens Aktiengesellschaft, Munich, Fed. Rep. of Germany

[21] Appl. No.: 632,933

[22] Filed: Dec. 20, 1990

Related U.S. Application Data

[63] Continuation of PCT DE 89/00244, Apr. 20, 1989

[30] Foreign Application Priority Data

Apr. 20, 1988 [DE] Fed. Rep. of Germany ....... 3813315

[51] Int. Cl.$^5$ ................................................ H01S 3/00
[52] U.S. Cl. ........................................ 372/38; 372/57; 372/81; 372/83
[58] Field of Search .................. 372/38, 81, 83, 57

[56] References Cited

U.S. PATENT DOCUMENTS

| | | | |
|---|---|---|---|
| 4,573,160 | 2/1986 | Cirkel et al. | 372/38 |
| 4,635,267 | 1/1987 | Cirkel et al. | 372/38 |
| 4,763,093 | 8/1988 | Cirkel et al. | 336/58 |

FOREIGN PATENT DOCUMENTS 1016641 8/1977 Canada .

OTHER PUBLICATIONS

Review of Scientific Instruments, vol. 57, No. 12, Dec. 1986, American Institute of Physics (New York, US), S. Watanabe et al; "High Repetition Long Pulse XeCl Laser with a Coaxial Ceramic Pulse-Forming Line" pp. 2970-2973.
Laser and Optoelektronik, vol. 16, No. 2, Jun. 1984 (Stuttgart, DE), D. Basting et al.: "Thyratrons with Magnetic Switches: the Key to Reliable Excimer Lasers" pp. 128-131.
Appl. Phys. Lett. 48 (23), Jun. 9, 1986, pp. 1574-1576; C. H. Fisher et al.: "High Efficiency XeCl-Laser with Spiker and Magnetic Isolation".
Los Alamos National Laboratory Report, LA-88 62-MS, Sep. 1981; W. C. Nunally: "Magnetic Switches and Circuits".

*Primary Examiner*—Georgia Y. Epps
*Attorney, Agent, or Firm*—Herbert L. Lerner; Laurence A. Greenberg

[57] ABSTRACT

An apparatus and method for generating high-power, high-voltage pulses for a laser having laser electrodes with an electrode path includes at least one charge unit. A pulse-generating network has an input side connected to the at least one charge unit and an output side connected to the laser electrodes. The pulse-generating network has a first branch and a second branch connected parallel to one another and connected to the laser electrodes. The first branch has a first charge capacitor with a relatively high capacitance and a magnetic switch in the form of a saturatable inductor connected in series with the first charge capacitor. The second branch has a second charge capacitor with a relatively low capacitance. A trigger branch is connected parallel to the electrode path. The trigger branch has at least one high-voltage switch and an in-series inductance. The high voltage switch serves as a trigger for initiating a saturation of the magnetic switch and a discharge of the first charge capacitor through the saturated magnetic switch into the laser electrode path.

15 Claims, 3 Drawing Sheets

PRIOR ART

APPARATUS AND METHOD FOR GENERATING HIGH-POWER, HIGH-VOLTAGE PULSES, PARTICULARLY FOR TE GAS LASERS

CROSS-REFERENCE TO RELATED APPLICATION

This application is a continuation of International Application PCT/DE89/00244, filed Apr. 20, 1989.

BACKGROUND OF THE INVENTION

1. Field of the Invention

The invention relates to an apparatus for generating high-power or output, high-voltage pulses, particularly for TE gas lasers, having at least one charge unit, and a pulse-generating network connected on the input side to the at least one charge unit and on the output side to the laser electrodes, a first branch and a second branch connected parallel to one another to the laser electrodes, the first branch having a first charge capacitor of relatively high capacitance and a magnetic switch connected in series therewith in the form of a saturatable inductor, and the second branch having a second charge capacitor, the second charge capacitor having a lower capacitance than the first charge capacitor, at least one high-voltage switch serving as a trigger for initiating a saturation of the magnetic switch and the discharge of the first charge capacitor into the laser electrode path, through the saturable magnetic switch.

In the prior art, voltages across the laser electrodes of up to 50 KV, depending on the electrode spacing and pressure, are needed to operate transversely excited (TE) excimer lasers. The voltage increase at the laser electrodes is tripped by a suitable switching operation in a so-called pulse generating network. The duration of the voltage increase is on the order of magnitude of from several tens of nanoseconds up to a hundred nanoseconds. The switch being used must have a high holding voltage, must be capable of switching high peak currents, and must have a long service life. It is only for low switching energies that the hydrogen-filled thyratrons typically used as switches meet these requirements. With increasing energy, thyratrons can no longer handle the high peak currents and yet still have an adequate service life.

Major efforts have therefore been devoted to relieving thyratrons or replacing them with other types of switches. For instance, circuits have been proposed that have a combination of magnetic switches as a passive switch element, and a spark gap as an active switch. For example, reference is made to an article entitled "High Efficiency XeCl Laser with Spiker and Magnetic Isolation" by C. H. Fisher et al, Applied Physics Letters 48 (23), Jun. 9, 1986, pp. 1574–1576. FIG. 1 shows a basic circuit diagram. Information on the basic operation of magnetic switches can be found in the literature, for instance in a publication entitled "Magnetic Switches and Circuits" by W. C. Nunnally, Los Alamos National Laboratory Report, LA-88 62 MS, published in September 1981. Only the function of the circuit will be explained herein.

A disadvantage of such circuitry is the high voltage occurring at the switch element at the spark gap, which makes it impossible to use economical thyratrons under some circumstances. Moreover, if a pulsed capacitor charging is used, one additional switch element is needed. In such a circuit, the switch element (at a spark gap or a thyratron, for instance) is not grounded, so that the voltage supply of the circuit (trigger voltage or heating voltage, for instance) is likewise exposed to the high voltages to be switched.

It is accordingly an object of the invention to provide an apparatus and method for generating high-power, high-voltage pulses, particularly for TE gas lasers, which overcome the hereinafore-mentioned disadvantages of the heretofore-known methods and devices of this general type, and in other words in which the voltage and current load of the high-voltage switch in the trigger branch can be reduced without having to make sacrifices in terms of the efficiency of the laser discharge.

SUMMARY OF THE INVENTION

With the foregoing and other objects in view there is provided, in accordance with the invention, an apparatus for generating high-power, high-voltage pulses for a laser having laser electrodes with an electrode path, comprising at least one charge unit, a pulse-generating network having an input side connected to the at least one charge unit and an output side connected to the laser electrodes, the pulse-generating network having a first branch and a second branch connected parallel to one another and connected to the laser electrodes, the first branch having a first charge capacitor with a relatively high capacitance and a magnetic switch in the form of a saturable inductor connected in series with the first charge capacitor, the second branch having a second charge capacitor with a relatively low capacitance, and a trigger branch connected parallel to the electrode path, the trigger branch having at least one high-voltage switch and an inductance connected in series therewith, the high-voltage switch serving as a trigger for initiating a saturation of the magnetic switch and a discharge of the first charge capacitor through the saturated magnetic switch into the laser electrode path.

In accordance with another feature of the invention, the trigger branch includes a series circuit of a high-voltage switch and a choke. One particular example of such a high-voltage switch is a thyratron.

In accordance with a further feature of the invention, the trigger branch has a magnetic switch, the pulse generating network has a high potential series branch connected to one of the laser electrodes, the pulse generating network has a pulse charging stage, the pulse charging stage includes a temporary storage capacitor to be charged by the at least one charge unit and a series circuit having a high-voltage switch and an inductive resistor, the temporary storage capacitor has a high potential pole, and the series circuit has one end connected the high potential pole and another end connected to the high potential series branch.

In accordance with an added feature of the invention, the capacitance of the first charge capacitor is suitably at least one order of magnitude greater than, or in other words at least ten times as great, as that of the second charge capacitor because the first charge capacitor is the energy supplier for maintaining the laser discharging.

In accordance with an additional feature of the invention, the capacitance of the first charge capacitor is 15 to 20 times as high as that of the second charge capacitor.

In accordance with yet another feature of the invention, the magnetic switch is connected downstream of the first charge capacitor in the first branch, as seen in a direction from a high potential to ground potential, and the magnetic switch is directly grounded.

In accordance with yet a further feature of the invention, there is provided a voltage pulse source being connected in parallel with the magnetic switch and being connected to the at least one charge unit.

In accordance with yet an added feature of the invention, the voltage pulse source and the at least one charge unit have power supply points being electrically separated from one another by the first charge capacitor.

In accordance with yet an additional feature of the invention, the voltage pulse source has a pulsed voltage with a polarity reinforcing discharging of the second charge capacitor after closure of the trigger branch.

In accordance with again another feature of the invention, the at least one charge unit is a first charge unit, the trigger branch is a first trigger branch, the voltage pulse source includes a second charge unit and a coupling circuit, the coupling circuit is an LC-inversion circuit having two charging capacitors being chargeable by the second charging unit and forming a series branch connected in parallel with the magnetic switch, and the coupling circuit has a second trigger branch including a series circuit of a high voltage switch and a choke.

In accordance with again a further feature of the invention, there is provided a pulse transformer through which the voltage pulse source is connected parallel to the magnetic switch.

In accordance with again an added feature of the invention, the voltage pulse source includes a coupling circuit connected parallel to the magnetic switch through the pulse transformer.

With the objects of the invention in view there is also provided a method for generating high-voltage pulses for a TE gas laser having laser electrodes with an apparatus for generating the pulses, the apparatus including a pulse generating network having an output side, at least one charge unit charging the pulse generating network to a charge voltage being applied on the output side of the pulse generating network to the laser electrodes; the pulse generating network having a first branch receiving the charge voltage and including a first charge capacitor with a relatively high capacitance and a magnetic switch in the form of a saturable inductor connected in series with the first charge capacitor; and the pulse generating network having a second branch connected parallel to the first branch receiving the charge voltage and including a second charge capacitor with a capacitance being at least one order of magnitude lower than the capacitance of the first charge capacitor and being connected parallel to the laser electrodes; and a trigger branch having a choke and at least one high-voltage switch initiating saturation of the magnetic switch by a closure of the at least one high-voltage switch; and the method comprises a) charging the charge capacitors, before firing begins between the laser electrodes, to a voltage being approximately equivalent to twice the arc drop voltage of the laser, and maintaining the magnetic switch in an unsaturated state; b) subsequently closing the high-voltage switch of the trigger branch and at least partly discharging the second charge capacitor through the inductance of the trigger branch while maintaining the charge at the first charge capacitor practically unchanged with a merely slight magnetizing current flowing through the magnetic switch; c) subsequently bringing the magnetic switch to saturation, and causing a charge transfer current to flow from the first charge capacitor to the at least partially discharged second charge capacitor with the inductance and impedance of the magnetic switch being greatly reduced in the saturation state, increasing the voltage at the laser electrodes to approximately twice the charge voltage with the charge transfer current for effecting firing of the laser; d) then feeding the stored energy of the first charge capacitor into the laser discharge through the saturated and therefore highly conducting magnetic switch; and e) beginning charging of the charge capacitors again as in steps a) through d) after the end of a laser discharge.

With the objects of the invention in view, there is furthermore provided an apparatus for generating high-power, high-voltage pulses for a laser having laser electrodes with an electrode path, comprising at least one first charge unit, a pulse generating network having an input side connected to the at least one first charge unit and an output side connected to the laser electrodes, the pulse-generating network having a first branch and a second branch connected parallel to one another and connected to the laser electrodes, the first branch having a first charge capacitor with a relatively high capacitance and a magnetic switch in the form of a saturable inductor connected in series with the first charge capacitor, the second branch having a second charge capacitor with a relatively low capacitance, the magnetic switch being connected downstream of the first charge capacitor in the first branch, as seen in a direction from a high potential to ground potential, and the magnetic switch being directly grounded, a voltage pulse source connected parallel to the magnetic switch, the voltage pulse source including a second charge unit, a coupling circuit and a trigger branch, the trigger branch including a high-voltage switch and an in-series inductance, the coupling circuit including electrical energy storage means being chargeable by the second charge unit, the high-voltage switch serving as a trigger for feeding a high-voltage pulse from the voltage pulse source and initiating a saturation of the magnetic switch and a discharge of the first charge capacitor through the saturated magnetic switch into the laser electrode path, the polarity and the magnitude of the high-voltage pulse being selected for one of reinforcement of discharging of the second charge capacitor and charging the second charge capacitor to a laser break through high-voltage potential adapted to initiate a laser discharge.

Other features which are considered as characteristic for the invention are set forth in the appended claims.

Although the invention is illustrated and described herein as embodied in an apparatus and method for generating high-power, high-voltage pulses, particularly for TE gas lasers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
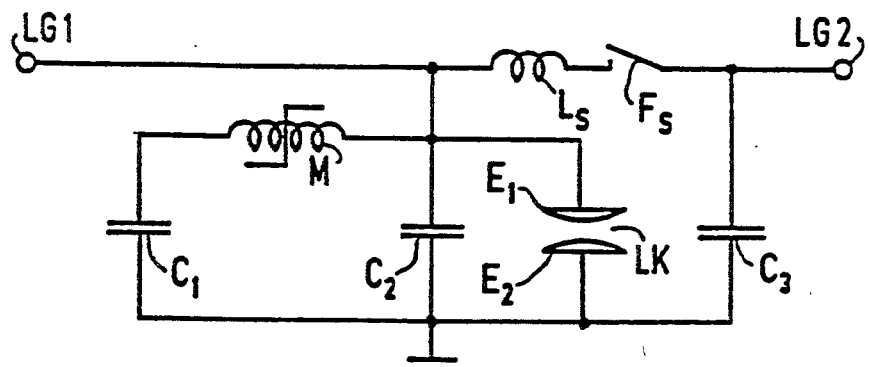
FIG. 1 is a schematic circuit diagram of a prior art device.

Referring now in general to the figures of the drawings, in which elements that are unnecessary for a comprehension of the invention, such as preionizing devices, have been omitted, it is seen that reference numerals LG1 and LG2 refer to bushings of respective first and second charge units and LG is a bushing of a (single) charge unit, although the rest of the charge units are not shown. First and second charge capacitors $C_1$ and $C_2$ will merely be referred to below as capacitors $C_1$ and $C_2$, for the sake of simplicity.

FIG. 1 shows a basic circuit diagram of an apparatus for generating high-voltage pulses that can be found in the aforementioned prior art. Reference numeral $C_1$ identifies an energy-storing capacitor, which is isolated from laser electrodes $E_1$ and $E_2$ by a magnetic or solenoid switch M. It is thus seen that a pulse generating network has first and second branches which are connected in parallel to each other and are connected to the laser electrodes $E_1$ and $E_2$. The first branch has the capacitor $C_1$ and the magnetic switch M being interconnected in series and the second branch has a capacitor $C_2$. Reference numerals $C_2$ and $C_3$ identify smaller capacitors which, together with a switch element having a spark gap $F_S$, provide for a voltage increase at a laser LK. A choke $L_S$ is connected between the bushing LGI and the switch element having the spark gap $F_S$. Prior to firing of the spark gap, the capacitors $C_1$ and $C_2$ are charged to a voltage that is equivalent to approximately twice the voltage that is established across the laser electrodes once the laser LK is fired (which is known as the arc-drop or burn voltage). The laser LK must maintain such a voltage over a relatively long period of time, without firing spontaneously. The capacitor $C_3$ is charged to a higher voltage, and after firing of the spark gap it transfers its charge to the capacitor $C_2$, so that a rapid voltage increase across the laser electrodes occurs until the laser breakdown. During that time, the magnetic switch M is unsaturated, so that because of its high inductance no significant current flows through the switch. The voltage at the capacitor $C_1$ therefore continues to be maintained. The core size and number of windings of the magnetic switch are constructed in such a way that it becomes saturated, or in other words has no inductance, at the instance of the laser breakdown. From that instant on, the capacitor $C_1$ can feed its energy into the laser LK. If the pulse generating network is well adapted to the laser resistance (that is, the square root of $L/C_1 \beta R_{laser}$, where $R_{laser}$ means the impedance of the laser), then improved coupling of energy into the laser and a resultant increase in its efficiency are possible. The active switch element (that is, at the spark gap $F_S$ or a thyratron) is markedly less heavily loaded in such circuitry than in conventionally constructed lasers, because only a fraction of the total stored energy is switched. The great majority of the energy flows across the magnetic switch after saturation.

As mentioned above, it is a disadvantage of such circuitry that the high voltage occurring at the switch element at the spark gap $F_S$ makes it impossible to use economical thyratrons under some circumstances. Additionally, if a pulsed capacitor charging is used, one additional switch element is required. In the circuit of FIG. 1, the switch element (at a spark gap SF or a thyratron, for instance) is not grounded, so that the voltage supply of the circuit (trigger voltage or heating voltage, for instance) is also exposed to the high voltages to be switched.

The characteristics and advantages of the invention will be described below in terms of the four exemplary embodiments of an apparatus and method according to the invention, by making reference to FIGS. 2-5.

Figure 2:
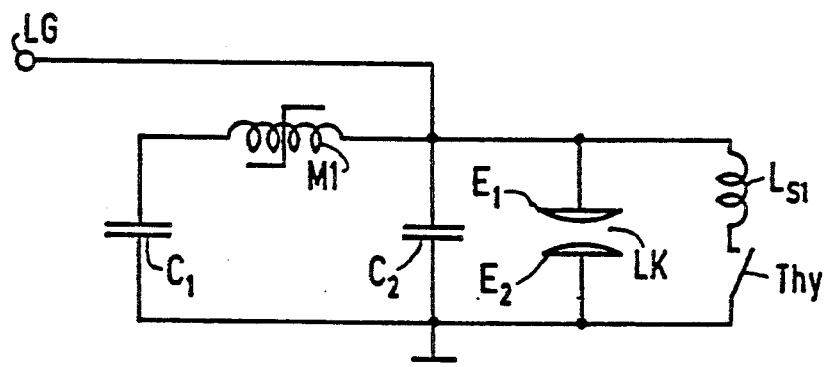
FIG. 2 is a circuit diagram of a first embodiment of an apparatus according to the invention, in which a trigger branch having a high-voltage switch is located parallel to the electrode path of the laser.

Referring initially to FIG. 2, it is seen that reference numeral $C_1$ stands for the energy-storing capacitor and reference $C_2$ indicates a smaller capacitor, which is required merely for firing the laser. A magnetic or solenoid switch M1 separates the capacitor $C_1$ from the rest of the circuit. The capacitor $C_3$ is no longer needed, so that a second charge unit is unnecessary as well. Besides the first branch having the capacitor $C_1$ as well as the magnetic switch M1 and the second branch having the capacitor $C_2$, FIG. 2 includes a trigger branch having an active switch Thy (which is a thyratron in this example) being connected in series with the inductance $L_{S1}$, and this series circuit is connected parallel to the laser electrodes $E_1$, $E_2$ of the laser LK and thus being grounded at one end. The voltage to which the switch Thy is exposed is thus equivalent to the laser voltage. It is no higher than in conventional circuitry.

Initially, the capacitors $C_1$ and $C_2$ are charged to a voltage that is equivalent to twice the arc-drop or burn voltage of the laser, and the magnetic switch M1 is unsaturated. After firing of the active switch Thy, the capacitor $C_2$ is discharged through a choke or in-series inductance $L_{s1}$ of the trigger branch, while the charge at the capacitor $C_1$ continues to be practically maintained. The instant of saturation of the magnetic switch M1 is specified by the core size, winding number and period $C_2 \cdot L_{s1}$. At that instant, the voltage at the capacitor $C_1$ is virtually unchanged and thus is higher than the voltage at the capacitor $C_2$, which of course has been partly discharged. A charge transfer from the capacitor $C_1$ to the capacitor $C_2$ therefore takes place which effects a voltage increase at the laser electrodes to twice the charge voltage, given a sufficiently low capacitance of the capacitor $C_2$ ($C_2 < < C_1$, $C_2$ completely discharged). The laser LK then fires, and the capacitor $C_1$ feeds its stored energy into the laser discharging through the saturated magnetic switch M1. The speed of the voltage increase in this circuit depends only on the capacitance of the capacitor $C_2$ and on the saturated inductive resistance of the magnetic switch M1. Unlike the circuit of FIG. 1, it is not dependent on the period in the switch loop (that is, on the inductive resistance $L_{s1}$), so that the peak current through the active switch can be further lowered by increasing the inductive resistance $L_{s1}$ of the switch.

The most varied types of switches (such as spark gaps, multi-channel spark gaps, pseudo-spark switches, thyratrons) may be used as the active switch element in this circuit. The scope of the invention is not limited to the use of a thyratron, and the use of a further magnetic or solenoid switch M2 which takes the place of the switch element, as seen in FIG. 3, should also be mentioned.

Figure 3:
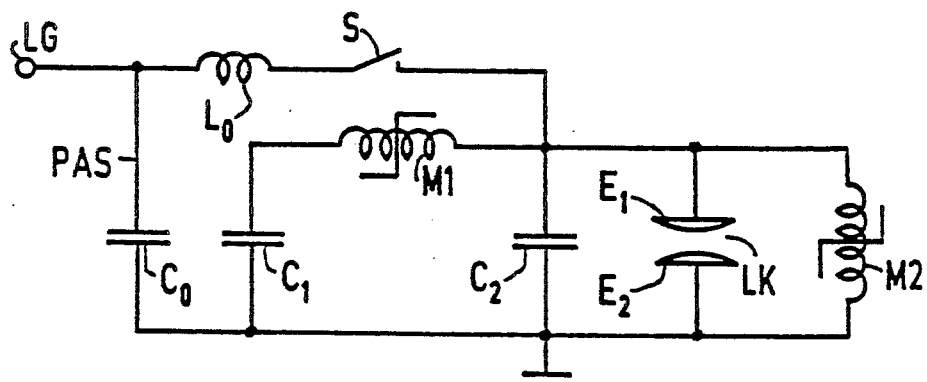
FIG. 3 is a circuit diagram of a second exemplary embodiment of an apparatus according to the invention, in which the trigger branch has a magnetic switch, and a pulse charging stage is part of the pulse generating or forming network.

Since an active switching operation continues to be necessary to induce the firing, a circuit for pulse charging of the capacitors $C_1$, $C_2$, including a temporary storage capacitor $C_0$, a choke $L_0$ and a switch S (for example, a thyratron), is used in the circuit of FIG. 3. The temporary storage capacitor $C_0$ has a high potential pole and the series circuit of elements S and $L_0$ has one end connected the high potential pole and another end connected to the high potential series branch of the pulse generating network. This pulse charging is present in any case in high-energy lasers, which work with so-called water capacitors as energy storing means, and the pulse charging therefore entails no additional expense. Accordingly, the switch S is not additionally loaded by the firing process tripped thereby.

Initially, in other words after the closure of the switch S, the magnetic switches M1 and M2 are unsaturated. Since the pulse charging process takes several microseconds, the magnet core of the switch M2 must be constructed in terms of its size and winding number in such a way that it does not become saturated during this period of time. In contrast, the core of the switch M1 is constructed for a substantially shorter saturation time (typically, 200 ns). After the beginning of the pulse charging process, the core of the switch M1 accordingly saturates very quickly and thus enables a simultaneous charging of the capacitors $C_1$ and $C_2$. The core material of the switch M1 is selected in such a way that the core becomes unsaturated again once the pulse charging has ended. This is known as F material and has no remanence. At that moment, however, the magnetic switch M2 does saturate, so that the capacitor $C_2$ can be discharged. The other processes proceed as described above in conjunction with FIG. 2. In this variant circuit, no further active switch element is needed other than the switch S that is already present in many lasers.

It is apparent from the above description that the pulse charging process precedes the procedure of the method as described above for the first exemplary embodiment of FIG. 2, and that the two magnetic switches, i.e., the switch M1 and the other switch M2 disposed in the trigger branch as a high-voltage switch, advantageously cooperate.

Figure 4:
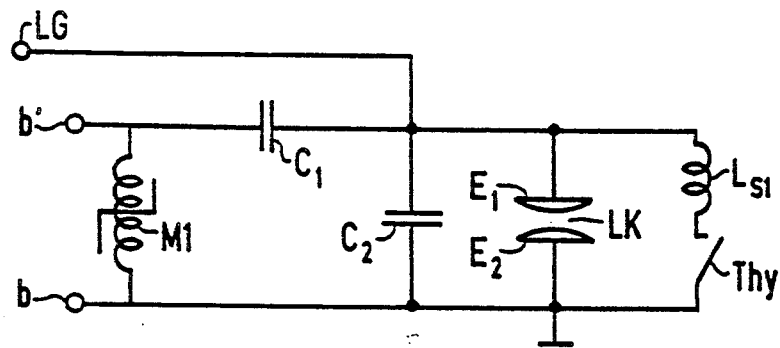
FIG. 4 is a circuit diagram of a third exemplary embodiment, in which the order of connection of the magnetic switch M1 and a first charge capacitor $C_1$ is transposed as compared to FIG. 2, so that the magnetic switch M1 is grounded directly at one end.

The third exemplary embodiment of FIG. 4 differs from the first exemplary embodiment of FIG. 2 in that the first charge capacitor $C_1$ and the saturable magnetic inductor or switch M1 change places. This has the advantage of connecting the saturable magnetic inductor, or simply the magnetic switch M1 as it is referred to for simplicity, to the ground potential. It is accordingly apparent from FIG. 4 that, as viewed in the direction from the high-value potential to the ground potential in the series circuit of the first branch, the magnetic switch M1 follows the first charge capacitor $C_1$, and accordingly this magnetic switch is grounded directly. The circuit properties are principally unchanged by this structure. In other words, the method of the invention can be achieved with this circuit as well, in the same way as described above for FIG. 2, so that it is unnecessary to describe the procedure of the method in further detail herein.

Figure 5:
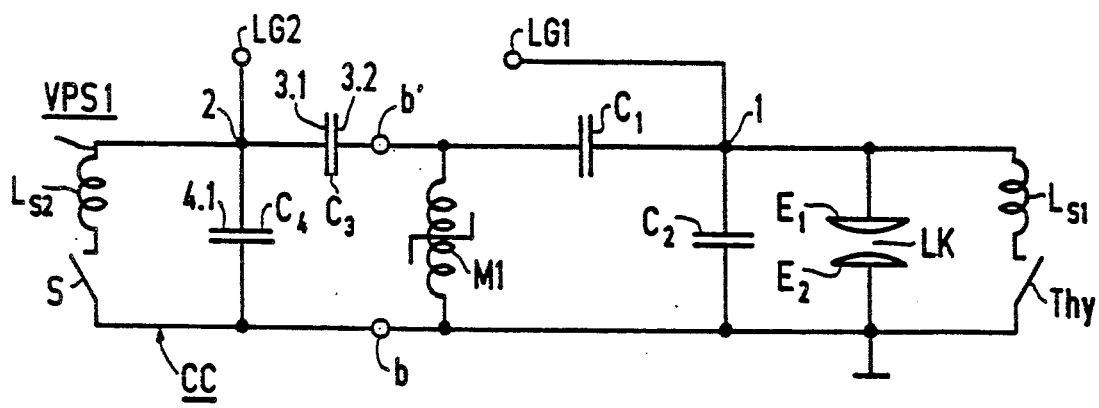
FIG. 5 is a circuit diagram of a fourth exemplary embodiment, in which an additional pulsed voltage source having a bushing LG2 connected to second charge unit is connected to circuit points b, b' of FIG. 4.

In the fourth exemplary embodiment of FIG. 5, in addition to the bushing LG1 connected to the first charge unit, a pulsed voltage source VPS1 is connected to the pulse-generating network in parallel with the magnetic switch M1. If one begins at imaginary circuit points or terminals b and b' of the circuit of FIG. 4, which are located at the two ends of the winding of the magnetic switch M1, then it can be seen that the additional pulsed voltage source VPS1 of FIG. 5 is connected to these imaginary circuits points b, b', as is also indicated by an imaginary dividing line shown with dashes. The pulsed voltage source VPS1 has the bushing LG2 connected to the second charge unit and a coupling circuit CC. In addition to the first trigger branch $L_{s1}$-Thy the coupling circuit CC has a second or additional trigger branch $L_{s2}$, S including a series circuit of a high-voltage switch S and a choke $L_{s2}$. The coupling circuit CC is constructed as an LC inversion circuit (which is also known as a Blumlein circuit), having two charge capacitors $C_3$ and $C_4$ with coatings or terminals 3.1, 3.2 and 4.1, 4.2, respectively. The charge capacitors $C_3$ and $C_4$ can be charged by the bushing LG2 connected to the second charge unit and are connected in parallel with the magnet switch M1 and in series with one another. The second trigger branch $L_{s2}$, S is connected in parallel with the charge capacitor $C_4$. The high end of the second trigger branch is connected at a circuit point 2 to a coating or terminal 4.1 of the charge capacitor $C_4$ as well as to a coating or terminal 3.1 of the charge capacitor $C_3$ and to the bushing LG2 connected to the second charge unit. A feed point 1 of the bushing LG1 connected to the first charge unit and the imaginary circuit point or terminal b' of the pulsed voltage source VPS1, are electrically disconnected from one another by the first charge capacitor $C_1$.

In order to couple a pulsed voltage source, it is also possible to use low-inductance, high-voltage pulse transformers, as is described in further detail in U.S. Pat. No. 4,763,093. For example, reference may be made to the description of FIG. 6 of that patent. An example of such a structure is shown in the circuit variant of FIG. 6, wherein a pulsed voltage source VPS2 and a pulse transformer PT are shown. Elements that are identical to the exemplary embodiment of FIG. 5 are identified by the same reference numerals in FIG. 6. There are many possible options for carrying the high-voltage pulses to a primary winding w1 of the pulse transformer PT. In the exemplary embodiment shown in FIG. 6, the LC inversion circuit of FIG. 5, including the bushing LG2 connected to the charge unit, is provided. The Blumlein circuit for the pulsed voltage source VPS1 accordingly appears again in the pulsed voltage source VPS2. The output of the coupling circuit CC is connected to the primary winding w1 of the pulse transformer PT through a first line 4 at high voltage potential, which is connected between the coating 3.2 of the charge capacitor $C_3$ and a middle pickup 5 of the primary winding w1. In contrast, a ground line 40 of the coupling circuit CC is connected to one outer end 6 of the primary winding w1 and through a branch line 8 to another outer end 7 of the primary winding w1.

Figure 6:
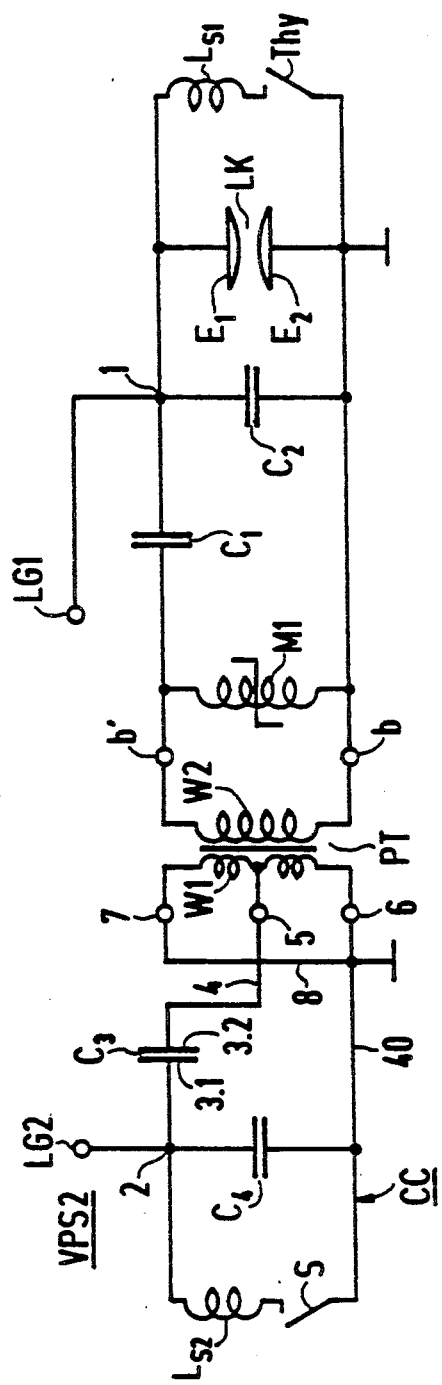
FIG. 6 is a variation of the embodiment of FIG. 5., in which the additional pulsed voltage source is connected to the pulse generating network via a low-induction pulse carrier.

An essential feature is that the pulsed voltage source VPS1 of FIG. 5 or VPS2 of FIG. 6 is in a position to furnish a high-voltage pulse at specified times. For the circuits of FIGS. 5 and 6, and in particular for the mode of operation of the pulsed voltage sources VPS1 and VPS2, the following general comments apply: On one hand, the polarity of the pulsed voltage that is generated at the magnet switch (imaginary terminals b, b') can be selected in such a way that the discharge process of the second charge capacitor $C_2$ that is initiated by the trigger branch $L_{sf}$-Thy, is reinforced. This reinforcement can be so great that the trigger branch $L_{sf}$-Thy or the switch Thy can be dispensed with. On the other hand, by dispensing with this trigger branch, the voltage at the second charge capacitor $C_2$ can be raised to the laser breakdown voltage with the switch S by means of the pulsed voltage source VPS1 or VPS2, without requiring prior discharging of the second charge capacitor $C_2$. The use of the pulse transformer PT of FIG. 6 is particularly advantageous in this connection, because the polarity of the high-voltage pulse is freely selectable as a result. In other words, depending on the polarity of the pulsed voltage, either the discharge process of the second charge capacitor $C_2$ initiated by the trigger branch $L_{sf}$-Thy is reinforced, or the trigger branch $L_{s1}$-Thy is no longer needed. Alternatively, either after partial discharging of the second charge capacitor $C_2$ by means of the trigger branch, or even without partial discharging, a voltage rise is brought about through the laser electrodes $E_1$, $E_2$, within a period of time that can be specified by the structure of the pulse circuit, independently of the circuit branch $C_1$-M1. In all cases, the magnet switch M1 must remain unsaturated during the coupling of the high-voltage pulse, so that short-circuiting of the pulsed voltage source VPS1 or VPS2 does not occur.

In the context of a first mode of operation of the circuits of FIGS. 5 and 6, the polarity of the pulsed voltage of the pulsed voltage sources VPS1, VPS2 can be selected in order to reinforce the discharging process of the second charge capacitor $C_2$ after the closure of the trigger branch $L_{sf}$-Thy. In contrast, the second mode of operation is in the context of using an apparatus of FIGS. 5 and 6 in which the trigger branch $L_{sf}$-Thy can be omitted. This use is directed to the generation of such a high pulsed voltage, and one that is polarized by means of the pulsed voltage sources VPS1, VPS2 in such a way that the second charge capacitor $C_2$ is discharged to a reinforced extent, or is charged to the laser breakdown voltage, so that even without closure of the trigger branch $L_{sf}$-Thy or without this trigger branch, the process of discharging the second charge capacitor $C_2$ and the flow of the charge transfer current from the first charge capacitor $C_1$ and the saturation of the magnet switch M1, are initiated.

It is apparent from this explanation that the two circuits of FIGS. 5 and 6 are highly versatile and are adaptable to the needs of the laser LK, and also that the high-voltage switches Thy and S are connected through one pole to ground, which simplifies the power supply to these switches, such as trigger voltage and heating voltage, because it is not exposed to the high voltages to be applied.

It should also be mentioned that the pulse charging stage in FIG. 3 is identified by the symbol PAS. With respect to FIG. 2, it should also be noted that the switching thyratron Thy shown in the trigger branch therein has an inductance of approximately 2 $\mu$H, which is high in comparison with the laser inductance (approximately 10 nH). In this version, the capacitance of the second charge capacitor $C_2$ is 15 nF, and that of the first charge capacitor $C_1$ is 235 nF. Pulse charging of the charge capacitors is performed within a time period of 5 $\mu$s, for instance, and after a brief discharging phase of the second charge capacitor $C_2$, within approximately 20 ns, a steep voltage increase to the laser breakdown voltage, or a value above it, occurs. The high capacitance of the first charge capacitor $C_1$, together with the laser inductance and the saturation inductance of the magnetic switches, produces relatively long laser current pulses. In order to provide preionization of the TE gas lasers, which are in particular constructed as excimer lasers, X-ray preionization is suitably used, because with it the required number of charge carriers (ions, electrons) can be made available virtually uniformly over the entire laser discharge volume. It is possible to reduce the current in the high-voltage switch element, in particular a thyratron, by approximately the factor of 1/5, in comparison with the prior art. As for the use of a thyratron in the trigger branch of the third to fifth exemplary embodiments of FIGS. 4 to 6, similar advantages are attained. The embodiment of FIG. 3 differs from the other exemplary embodiments through the use of a second magnetic switch M2, and as explained it is distinguished by an advantageous cooperation of the two magnetic switches M1 and M2.

We claim:

1. Apparatus for generating high-power, high-voltage pulses for a laser having laser electrodes with an electrode path, comprising:
   at least one charge unit,
   a pulse-generating network having an input side connected to said at least one charge unit and an output side connected to the laser electrodes,
   said pulse-generating network having a first branch and a second branch connected parallel to one another and connected to the laser electrodes, said first branch having a first charge capacitor with a relatively high capacitance and a magnetic switch in the form of a saturable inductor connected in series with said first charge capacitor, said second branch having a second charge capacitor with a relatively low capacitance, and a trigger branch connected parallel to the electrode path, said trigger branch having at least one high-voltage switch and an in-series inductance, said at least one high-voltage switch serving as a trigger for initiating a saturation of said magnetic switch and a discharge of said first charge capacitor through said saturated magnetic switch into the laser electrode path.

2. Apparatus according to claim 1, wherein said trigger branch is a series circuit of a high-voltage switch and a choke.

3. Apparatus according to claim 1, wherein said trigger branch has a magnetic switch connected in parallel to the electrode path, said pulse generating network has a high potential series branch connected to one of the laser electrodes, said pulse generating network has a pulse charging stage, said pulse charging stage includes a temporary storage capacitor to be charged by said at least one charge unit and a series circuit having a high-voltage switch and an inductive resistor, said temporary storage capacitor has a high potential pole, and said series circuit has one end connected to said high potential pole and another end connected to said high potential series branch.

4. Apparatus of claim 1, wherein the capacitance of said first charge capacitor is at least ten times as high as the capacitance of said second charge capacitor.

5. Apparatus according to claim 4, wherein the capacitance of said first charge capacitor is 15 to 20 times as high as the capacitance of said second charge capacitor.

6. The apparatus of claim 1, wherein said magnetic switch is connected downstream of said first charge capacitor in said first branch, as seen in a direction from a high potential to ground potential, and said magnetic switch is directly grounded.

7. Apparatus according to claim 6, including a voltage pulse source being connected in parallel with said magnetic switch and being connected to said at least one charge unit.

8. Apparatus according to claim 7, wherein said voltage pulse source and said at least one charge unit have power supply points being electrically separated from one another by said first charge capacitor.

9. Apparatus according to claim 7, wherein said voltage pulse source has a pulsed voltage with a polarity reinforcing discharging of said second charge capacitor after closure of said trigger branch.

10. Apparatus according to claim 7, wherein said at least one charge unit is a first charge unit, said trigger branch is a first trigger branch, said voltage pulse source includes a second charge unit and a coupling circuit, said coupling circuit is an LC-inversion circuit having two charging capacitors being chargeable by said second charging unit and forming a series branch connected in parallel with said magnetic switch, and said coupling circuit has a second trigger branch including a series circuit of a high voltage switch and a choke.

11. Apparatus according to claim 7, including a pulse transformer through which said voltage pulse source is connected parallel to said magnetic switch.

12. Apparatus according to claim 11, wherein said voltage pulse source includes a coupling circuit connected parallel to said magnetic switch through said pulse transformer.

13. Method for generating high-voltage pulses for a TE gas laser having laser electrodes with an apparatus for generating the pulses, the apparatus including:
  A) a pulse generating network having an output side, at least one charge unit charging the pulse generating network to a charge voltage being applied on the output side of the pulse generating network to the laser electrodes;
  B) the pulse generating network having a first branch receiving the charge voltage and including a first charge capacitor with a relatively high capacitance and a magnetic switch in the form of a saturable inductor connected in series with the first charge capacitor;
  and the pulse generating network having a second branch connected parallel to the first branch receiving the charge voltage and including a second charge capacitor with a capacitance being at least one order of magnitude lower than the capacitance of the first charge capacitor and being connected parallel to the laser electrodes; and
  C) and a trigger branch connected in parallel to the electrode path, said trigger branch having a choke and at least one high-voltage switch initiating saturation of the magnetic switch by a closure of the at least one high-voltage switch; and the method comprises:
  a) charging the charge capacitors, before firing begins between the laser electrodes, to a voltage being approximately equivalent to twice the arc drop voltage of the laser, and maintaining the magnetic switch in an unsaturated state;
  b) subsequently closing the high-voltage switch of the trigger branch and at least partly discharging the second charge capacitor through the choke while maintaining the charge at the first charge capacitor practically unchanged with a magnetizing current flowing through the magnetic switch;
  c) subsequently bringing the magnetic switch to saturation, and causing a charge transfer current to flow from the first charge capacitor to the at least partially discharged second charge capacitor with the inductance and impedance of the magnetic switch being greatly reduced in the saturation state, increasing the voltage at the laser electrodes to approximately twice the charge voltage with the charge transfer current for effecting firing of the laser;
  d) then feeding the stored energy of the first charge capacitor into the laser discharge through the saturated and highly conducting magnetic switch; and
  e) beginning charging of the charge capacitors again as in steps a) through d) after the end of a laser discharge.

14. Method for generating high-voltage pulses for a laser having laser electrodes with an apparatus for generating the pulses, the apparatus including:
  A) a pulse generating network having an output side, at least one charge unit charging the pulse generating network to a charge voltage being applied on the output side of the pulse generating network to the laser electrodes;
  B) the pulse generating network having a first branch receiving the charge voltage and including a first charge capacitor with a relatively high capacitance and a magnetic switch in the form of a saturable inductor connected in series with the first charge capacitor;
  and the pulse generating network having a second branch connected parallel to the first branch receiving the charge voltage and including a second charge capacitor with a capacitance being lower than the capacitance of the first charge capacitor and being connected parallel to the laser electrodes; and
  C) and a trigger branch connected in parallel to the electrode path, said trigger branch having a choke and at least one high-voltage switch initiating saturation of the magnetic switch by a closure of the at least one high-voltage switch; and the method comprises:
  a) charging the charge capacitors, before firing begins between the laser electrodes, to a voltage being higher than the arc drop voltage of the laser, and maintaining the magnetic switch in an unsaturated state;
  b) subsequently closing the high-voltage switch of the trigger branch and at least partly discharging the second charge capacitor through the choke while maintaining the charge at the first charge capacitor with a magnetizing current flowing through the magnetic switch;

c) subsequently bringing the magnetic switch to saturation, and causing a charge transfer current to flow from the first charge capacitor to the at least partially discharged second charge capacitor with the inductance and impedance of the magnetic switch being reduced in the saturation state, increasing the voltage at the laser electrodes with the charge transfer current for effecting firing of the laser;

d) then feeding the stored energy of the first charge capacitor into the laser discharge through the saturated and conducting magnetic switch; and e) beginning charging of the charge capacitors again after the end of a laser discharge.

15. Apparatus for generating high-power, high-voltage pulses for a laser having laser electrodes with an electrode path, comprising:

at least one first charge unit, a pulse generating network having an input side connected to said at least one first charge unit and an output side connected to the laser electrodes, said pulse-generating network having a first branch and a second branch connected parallel to one another and connected to the laser electrodes, said first branch having a first charge capacitor with a relatively high capacitance and a magnetic switch in the form of a saturatable inductor connected in series with said first charge capacitor, said second branch having a second charge capacitor with a relatively low capacitance, said magnetic switch being connected downstream of said first charge capacitor in said first branch, as seen in a direction from a high potential to ground potential, and said magnetic switch being directly grounded, a voltage pulse source connected parallel to said magnetic switch, said voltage pulse source including a second charge unit, a coupling circuit and a trigger branch connected in parallel to the electrode path, said trigger branch including a high-voltage switch and an in-series inductance, said coupling circuit including electrical energy storage means being chargeable by said second charge unit, said high-voltage switch serving as a trigger for feeding a high-voltage pulse from said voltage pulse source and initiating a saturation of said magnetic switch and a discharge of said first charge capacitor through said saturated magnetic switch into the laser electrode path, the polarity and the magnitude of the high-voltage pulse being selected for one of reinforcement of discharging of said second charge capacitor and charging said second charge capacitor to a laser break through high-voltage potential adapted to initiate a laser discharge.

* * * * *